(12) United States Patent
Arakawa et al.

(10) Patent No.: US 10,483,964 B2
(45) Date of Patent: Nov. 19, 2019

(54) SIGNAL PROCESSING DEVICE

(71) Applicant: KABUSHIKI KAISHA TOKAI RIKA DENKI SEISAKUSHO, Aichi (JP)

(72) Inventors: Natsuki Arakawa, Aichi (JP); Junichi Matsubara, Aichi (JP); Satoki Uruno, Aichi (JP); Kengo Shima, Aichi (JP); Daisuke Aoki, Aichi (JP); Yuichiro Mori, Aichi (JP)

(73) Assignee: KABUSHIKI KAISHA TOKAI RIKA DENKI SEISAKUSHO, Aichi (JP)

( * ) Notice: Subject to any disclaimer, the term of this patent is extended or adjusted under 35 U.S.C. 154(b) by 0 days.

(21) Appl. No.: 16/183,209

(22) Filed: Nov. 7, 2018

(65) Prior Publication Data
US 2019/0149147 A1  May 16, 2019

(30) Foreign Application Priority Data

Nov. 13, 2017  (JP) .................................. 2017-218502

(51) Int. Cl.
H03K 17/56  (2006.01)
(52) U.S. Cl.
CPC .................................... H03K 17/56 (2013.01)
(58) Field of Classification Search
None
See application file for complete search history.

(56) References Cited

U.S. PATENT DOCUMENTS

| | | | |
|---|---|---|---|
| 4,188,547 A | 2/1980 | Fox | |
| 7,486,532 B2 | 2/2009 | Han et al. | |
| 2005/0099068 A1* | 5/2005 | Kimura | H03K 19/01728 307/112 |
| 2007/0045827 A1 | 3/2007 | Han et al. | |
| 2014/0253181 A1* | 9/2014 | Mukherjee | H02M 3/1563 327/109 |

FOREIGN PATENT DOCUMENTS

| | | |
|---|---|---|
| JP | S52-156364 A | 12/1977 |
| JP | S 62-294329 | 12/1987 |
| JP | H09-46199 A | 2/1997 |
| JP | 2007-020136 | 1/2007 |
| WO | WO 2018/055666 A1 | 3/2018 |

* cited by examiner

Primary Examiner — Cassandra F Cox
(74) Attorney, Agent, or Firm — Greenblum & Bernstein, P.L.C.

(57) ABSTRACT

A signal processing device includes an input terminal configured to be input with an input signal that is active high or an input signal that is active low, a switching terminal connectable to a power supply or ground, a selection circuit configured to select and output the input signal that is active high in a case that the switching terminal is connected to the power supply and select and output the input signal that is active low in a case that the switching terminal is connected to the ground.

7 Claims, 2 Drawing Sheets

SIGNAL PROCESSING DEVICE

CROSS-REFERENCE TO RELATED APPLICATIONS

The present application is based on Japanese patent application No. 2017-218502 filed on Nov. 13, 2017, the entire contents of which are incorporated herein by reference.

TECHNICAL FIELD

The present invention relates to a signal processing device.

RELATED ART

As technologies in the related art, a signal processing device is known that includes an input terminal to which an active high switch and an active low switch are attachable and interchangeable, a determination device configured to determine an on/off state of a switch connected to the input terminal on the basis of a signal level of a signal input from the input terminal, and an active determination circuit configured to determine a bias voltage applied to a signal input port in a case that an output level at an active determination port provided to the determination device is inverted (e.g., JP H09-46199 A).

The determination device is configured to determine that a signal input element is in an off-state in a case that an input level at the signal input port changes and determine that a switch is in an on-state in a case that the input level at the signal input port remains unchanged when determining the output level of the active determination port.

The signal processing device can have a circuit common to both types of signal input elements, namely, an active high signal input element and an active low signal input element, resulting in reduction in cost.

SUMMARY

However, the signal processing device disclosed in JP H09-46199 A needs to have both the switches, namely, the active high switch and the active low switch. Furthermore, when both the switches are wired, and the switches are connected to the input terminal, the switches may be connected to a wrong terminal.

An object of the invention is to provide a signal processing device applicable to both the switches, namely, the active high switch and the active low switch, with a single circuit device.

To achieve the above described object, a signal processing device according to an aspect of the invention includes an input terminal configured to be input with an input signal that is active high or an input signal that is active low, a switching terminal connectable to a power supply or ground, and a selection circuit configured to select and output the input signal that is active high in a case that the switching terminal is connected to the power supply and select and output the input signal that is active low in a case that the switching terminal is connected to the ground.

Advantageous Effect of the Invention

According to an aspect of the invention, a signal processing device is applicable to both the switches, namely, the active high switch and the active low switch, with a single circuit device.

DESCRIPTION OF EMBODIMENTS

Overview of Embodiments

Figure 1A:
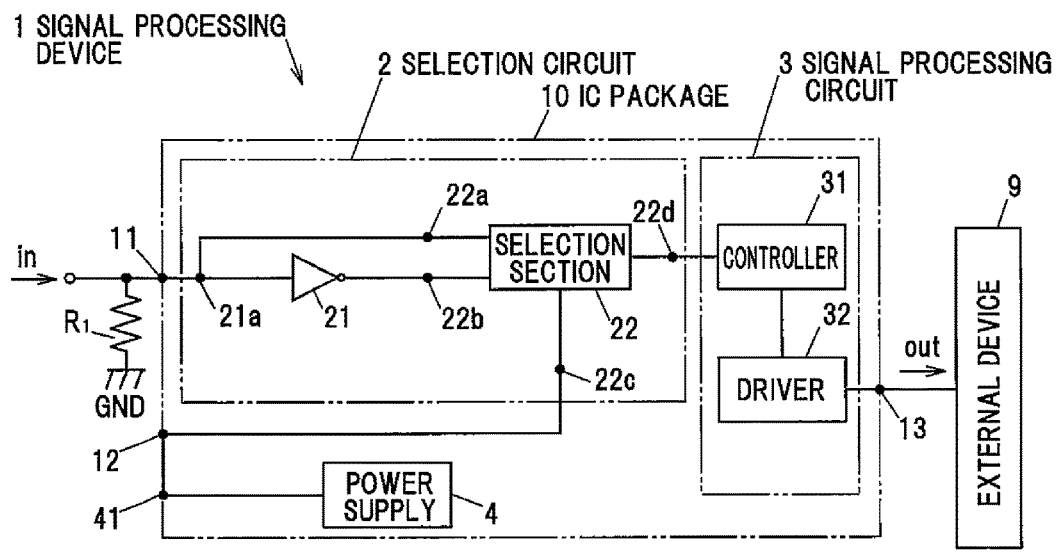
FIG. 1A is a circuit diagram illustrating an example of a configuration in a case that a signal processing device according to the present embodiment is used as an active high device.

A signal processing device (1) according to the present embodiment includes an input terminal (11) configured to be input with an input signal that is active high or an input signal that is active low, a switching terminal (12) connectable to a power supply (4) or ground (GND), a selection circuit (2) configured to select and output the input signal that is active high in a case that the switching terminal (12) is connected to the power supply (4) and select and output the input signal that is active low in a case that the switching terminal (12) is connected to the ground (GND).

In the signal processing device according to the present embodiment, only switching a destination of the switching terminal (12) between the power supply (4) and the ground (GND) allows the signal processing device to switch between an active high setting and an active low setting. That is, the signal processing device is applicable to both the switches, namely, the active high switch and the active low switch, with a single circuit device.

Embodiment

A signal processing device according to the present embodiments will be described with reference to FIGS. 1A and 1B and FIGS. 2A and 2B. This signal processing device is an electronic device used as an active high device configured to operate as a positive logic in which an input signal with a high level voltage (5 V) is represented as "1" and an input signal with a low level voltage (0 V) is represented as "0" and also used as an active low device configured to operate as a negative logic in which an input signal with a low level voltage (0 V) is represented as "1" and an input signal with a high level voltage (5 V) is represented as "0".

Overview of Signal Processing Device

As illustrated in FIGS. 1A and 1B and FIGS. 2A and 2B, a signal processing device 1 includes an input terminal 11, a switching terminal 12, an output terminal 13, a selection circuit 2, a signal processing circuit 3 configured to perform processing on the basis of an output signal output from the selection circuit 2, and a power supply 4 configured to produce a constant voltage. A signal input to the input terminal 11 is processed in the signal processing device 1 and output to an external device 9 connected to the output terminal 13. An example of the external device 9 is an LED display device, and the signal processing device 1 controls the LED display device so that the LED display device lights up and goes out.

Input Terminal

A switch element configured to transmit a digital switch signal is connected to the input terminal 11. Examples of the switch element may include a switch including contacts such as an ignition switch or a key switch and a switch not including contacts such as a transistor provided in ECU or the like. An input signal with an active-high high level voltage or an active-low low level voltage is input to the input terminal 11 from the above-described switch element.

As illustrated in FIG. 1A, in a case that the signal processing device 1 is used as an active high device, a pull-down resistor $R_1$ is provided to the input terminal 11 so that the voltage of a signal line is stabilized to a low level voltage (0 V) in a case that the above-described switch element turns off.

Figure 2A:
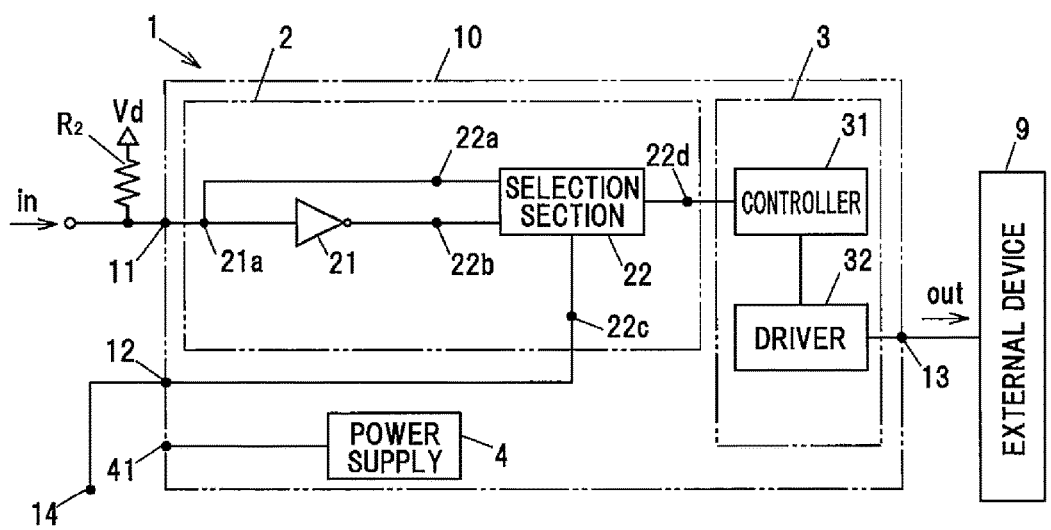
FIG. 2A is a circuit diagram illustrating an example of a configuration in a case that a signal processing device according to the present embodiment is used as an active low device.

As illustrated in FIG. 2A, in a case that the signal processing device 1 is used as an active low device, a pull-up resistor $R_2$ is provided to the input terminal 11 so that the voltage of the signal line is stabilized to a high level voltage (5 V) in a case that the above-described switch element turns off.

Switching Terminal

The switching terminal 12 can be connected to a power supply terminal 41 of the power supply 4 or a ground terminal 14 at one end thereof. The switching terminal 12 is connected to a third terminal 22c of a selection section 22 of the selection circuit 2 described below at the other end thereof.

In a case that the signal processing device 1 is used as an active high device, as illustrated in FIG. 1A, the switching terminal 12 is connected to the power supply terminal 41 when wiring the signal processing device 1. This allows a potential at the third terminal 22c of the selection section 22 to be a power-supply potential (voltage of the power supply 4).

Meanwhile, in a case that the signal processing device 1 is used as an active low device, as illustrated in FIG. 2A, the switching terminal 12 is connected to the ground terminal 14 when wiring the signal processing device 1. This allows a potential at the third terminal 22c of the selection section 22 to be a ground potential.

Power Supply

The power supply 4 is configured such that a 5V regulator is embedded in an IC package 10 to prepare a power-supply potential. The power supply 4 is used to execute operation of the IC package 10 and also set the above-described switching terminal 12 at 5 V.

Selection Circuit

The selection circuit 2 is configured to select and output an input signal with a high level voltage in a case that the switching terminal 12 is connected to the power supply terminal 41 and select and output an input signal with a low level voltage in a case that the switching terminal 12 is connected to the ground terminal 14. A multiplexer can be used in the selection circuit 2, for example.

More specifically, the selection circuit 2 includes an inverter 21 as a selection signal generating section and the selection section 22. The selection signal generating section is configured to generate selection signals including an input signal input to the input terminal 11 and an inverted signal obtained by inverting the input signal, and the selection section 22 is configured to select one of the selection signals as an output signal on the basis of a potential at the third terminal 22c as a connection terminal which is connected to the switching terminal 12.

The inverter 21 includes a terminal 21a as its input terminal connected to the input terminal 11 and an output end connected to a second terminal 22b which is an input end of the selection section 22. The selection section 22 includes a first terminal 22a to which an input signal input to the input terminal 11 is allowed to input and the second terminal 22b to which an inverted signal obtained by inverting the input signal with the inverter 21 is input. In a case that a signal with a high level voltage is input to the input terminal 11, a high level signal having the same logical level as that of the input signal is allowed to output to the first terminal 22a, and a low level signal having the inverted logical level of the high level signal is output to the second terminal 22b. Meanwhile, in a case that a signal with a low level voltage is input to the input terminal 11, a low level signal having the same logical level as that of the input signal is allowed to output to the first terminal 22a, and a high level signal having the inverted logical level of the low level signal is output to the second terminal 22b.

In a case that the third terminal 22c is set at a power-supply potential, the selection section 22 outputs a signal input to the first terminal 22a to a fourth terminal 22d at an output end as an output signal. In a case that the third terminal 22c is set at a ground potential, the selection section 22 outputs a signal input to the second terminal 22b to the fourth terminal 22d as an output signal. In other words, the selection section 22 selects the input signal of the inverter 21 as an output signal in a case that the third terminal 22c is set at a power-supply potential and the inverted signal output from the inverter 21 as an output signal in a case that the potential at the third terminal 22c is a ground potential.

Signal Processing Circuit

The signal processing circuit 3 includes a controller 31 configured to output a control signal for controlling the external device 9 and a driver 32 configured to drive the external device 9. The controller 31 is connected to the fourth terminal 22d of the selection section 22 of the selection circuit 2.

The controller 31 outputs a control signal for controlling the external device 9 on the basis of the selection signal selected by the selection section 22. In the present embodiment, the controller 31 is configured to output a signal corresponding to an on-state of the external device 9 in a case that the selection signal from the selection section 22 is a signal with a high level voltage and a signal corresponding to an off-state of the external device 9 in a case that the selection signal is a signal with a low level voltage. The control signal output from the controller 31 is output to the external device 9 as an optical signal, for example, via the driver 32.

IC Package

Figure 1B:
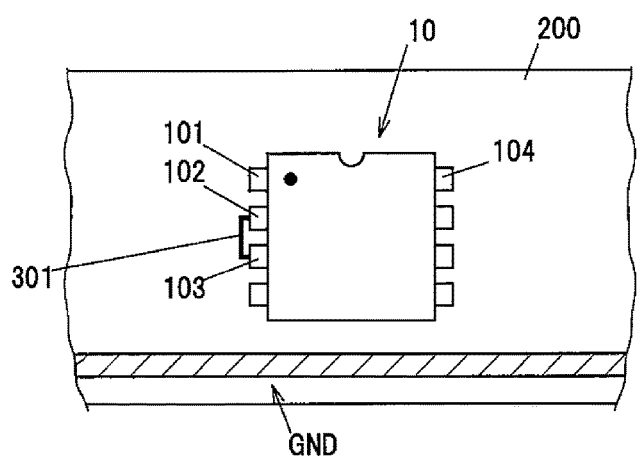
FIG. 1B is a plan view illustrating a configuration of an IC package in a case that a signal processing device is used as an active high device.
Figure 2B:
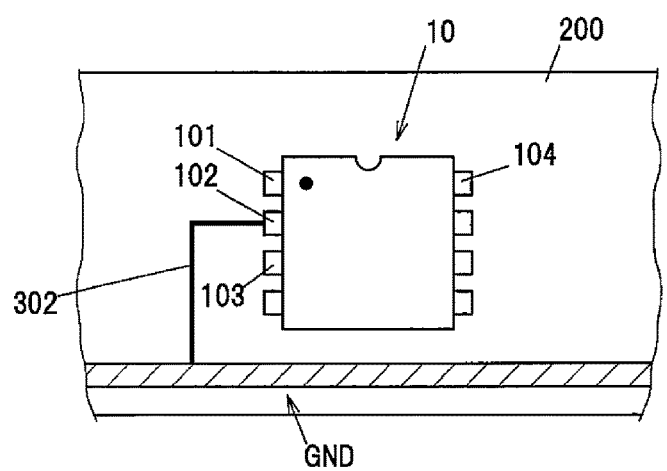
FIG. 2B is a plan view illustrating a configuration of an IC package in a case that a signal processing device is used as an active low device.

The signal processing device 1 includes the IC package 10 including the selection circuit 2, the signal processing circuit 3, and the power supply 4 therein. As illustrated in FIG. 1B and FIG. 2B, the IC package 10 is mounted on a flexible substrate 200. Note that in FIG. 1B and FIG. 2B, the external device 9, the pull-down resistor $R_1$, and the pull-up resistor $R_2$ are not illustrated.

The IC package 10 includes a first pin 101 which is a part of the input terminal 11, a second pin 102 which is a part of the switching terminal 12, a third pin 103 which is a part of a power supply terminal 41, and an eighth pin 104 which is a part of the output terminal 13. These pins are exposed to the outside of the IC package 10.

As illustrated in FIG. 1B, in a case that the IC package 10 is used for an active high electronic circuit, the second pin 102 and the third pin 103 are connected to each other with a connector 301 therebetween. The second pin 102 and the third pin 103 are connected to each other with a chip resistor or a circuit pattern therebetween, for example. In this case, the switching terminal 12 is connected to the power supply 4, and the third terminal 22c of the selection section 22 in the selection circuit 2 is set at a power supply potential, allowing the signal processing device 1 to operate as an active high electronic circuit.

As illustrated in FIG. 2B, in a case that the IC package 10 is used for an active low electronic circuit, the second pin 102 is connected to GND with a connector 302 formed from a chip resistor or a circuit pattern therebetween. In this case, the switching terminal 12 is electrically grounded, and the third terminal 22c of the selection section 22 is set at a ground potential, allowing the signal processing device 1 to operate as an active low electronic circuit.

In the IC package 10 described-above, a single IC can share an active high and an active low electronic circuits. This can reduce the development man-hour. Furthermore, a mass production effect with increasing production volume of the IC can be obtained. This can reduce a unit price of the IC.

Operation of Signal Processing Device

The signal processing device 1 according to the present embodiment described above operates as follows.

As illustrated in FIG. 1A, in a case that the signal processing device 1 is used as an active high device, the switching terminal 12 is connected to the power supply terminal 41 of the power supply 4. In a case that an input signal with a high level voltage is input to the input terminal 11, the selection section 22 of the selection circuit 2 allows an input signal with a high level voltage to be input to the signal processing circuit 3, and the controller 31 outputs the control signal for setting the external device 9 to an on-state. The control signal from the controller 31 is output to the external device 9 via the output terminal 13, and thus the external device 9 is set to an on-state. For example, in a case that the external device 9 is an LED display device, the LED display device switches from a going-out state to a lighting-up state.

Meanwhile, in a case that the switch element connected to the input terminal 11 is switched to an off-state from an on-state, and thus an input signal with a low level voltage is input to the input terminal 11, the selection section 22 of the selection circuit 2 outputs a signal with a low level voltage as a selection signal. This allows the controller 31 to output a control signal for setting the external device 9 to an off-state and the external device 9 to be switched to an off-state, that is, for the LED display device, switched from a lighting-up state to a going-out state.

As illustrated in FIG. 2A, in a case that the signal processing device 1 is used as an active low device, the switching terminal 12 is connected to the ground terminal 14. In a case that the switch element connected to the input terminal 11 is switched to an on-state from an off-state, and thus an input signal with a low level voltage is input to the input terminal 11, the selection section 22 of the selection circuit 2 allows an input signal with a high level voltage to be input to the signal processing circuit 3, and the controller 31 outputs the control signal for setting the external device 9 to an on-state. The control signal from the controller 31 is output to the external device 9 via the output terminal 13, and thus the external device 9 is set to an on-state. For example, in a case that the external device 9 is an LED display device, the LED display device switches from a going-out state to a lighting-up state.

Meanwhile, in a case that the switch element is switched to an off-state from an on-state, and thus an input signal with a high level voltage is input to the input terminal 11, the selection section 22 of the selection circuit 2 outputs a signal with a low level voltage as a selection signal. This allows the controller 31 to output a control signal for setting the external device 9 to an off-state and the external device 9 to be switched to an off-state, that is, for the LED display device, switched from a lighting-up state to a going-out state.

Effect of Embodiments

In the signal processing device 1 described above according to the present embodiment, connecting the switching terminal 12 to either the power supply 4 or ground allows a single IC package 10 to share an active high circuit and an active low circuit. That is, the signal processing device is applicable to both the switches, namely, the active high switch and the active low switch, with a single circuit device.

The switch elements need only be connected to a single input terminal 11 when wiring the signal processing device 1. This can reduce the possibility that the switch element is connected to a wrong terminal compared to a case of the signal processing device including a plurality of switch elements as described in JP H09-46199 A.

Furthermore, the signal processing device 1 according to the present embodiment can be used as both the active high device and the active low device with the single signal processing device 1. This can set a unit price low because the production volume can be increased, compared to a case that each of the active high signal processing device and the active low signal processing device needs to be prepared.

Although the invention has been described on the basis of the embodiments, the invention according to claims is not to be limited to the embodiment described above. Furthermore, it should be noted that all combinations of the features described in the embodiment are not necessary to solve the problem of the invention. The invention can be implemented without departing from the gist thereof.

REFERENCE SIGNS LIST

1 Signal processing device
2 Selection circuit
4 Power supply
9 External device
11 Input terminal
12 Switching terminal
13 Output terminal 14 Ground terminal
21 Inverter
21a Terminal
22 Selection section
22a First terminal
22b Second terminal
22c Third terminal
22d Fourth terminal
31 Controller
32 Driver
41 Power supply terminal
101 First pin
102 Second pin
103 Third pin
104 Eighth pin

The invention claimed is:

1. A signal processing device, comprising:
   an input terminal configured to be input with an input signal that is active high or an input signal that is active low;
   a switching terminal connectable to a power supply or ground;
   a selection circuit configured to select and output the input signal that is active high in a case that the switching terminal is connected to the power supply and select and output the input signal that is active low in a case that the switching terminal is connected to the ground.

2. The signal processing device according to claim 1, wherein the selection circuit includes a selection signal generating section configured to generate selection signals including the input signal and an inverted signal obtained by inverting the input signal, and a selection section configured to select one of the selection signals as an output signal, based on a potential at a connection terminal connected to the switching Terminal.

3. The signal processing device according to claim 2, wherein the selection section is configured to select the input signal of the selection signal generating section as an output signal in a case that the connection terminal is set at a power supply potential and select the inverted signal of the selection signal generating section as an output signal in a case that the connection terminal is set at a ground potential.

4. The signal processing device according to claim 1, comprising:
   the selection circuit;
   a signal processing circuit configured to perform processing, based on the output signal output from the selection circuit; and
   an IC package including the selection circuit and the signal processing circuit in the IC package, wherein
   a part of the input terminal and a part of the switching terminal are exposed to the outside of the IC package.

5. The signal processing device according to claim 1, further comprising a switch element that is connected to the input terminal and transmits a digital switch signal as the input signal.

6. The signal processing device according to claim 1, wherein, when the active high input signal is input to the input terminal, a pull-down resistor is attached to the input terminal.

7. The signal processing device according to claim 1, wherein, when the active low input signal is input to the input terminal, a pull-up resistor is attached to the input terminal.

* * * * *